United States Patent [19]
Elliott, Jr. et al.

[11] Patent Number: 5,214,653
[45] Date of Patent: May 25, 1993

[54] FAULT FINDER EXPERT SYSTEM

[75] Inventors: William M. Elliott, Jr., Palm Bay; Mordechay Schneider, Indialantic, both of Fla.

[73] Assignee: Harris Corporation, Melbourne, Fla.

[21] Appl. No.: 600,831

[22] Filed: Oct. 22, 1990

[51] Int. Cl.⁵ .................... G06F 11/00; G01R 31/28
[52] U.S. Cl. .................... 371/15.1; 364/276.3; 364/DIG. 1; 395/575; 395/916
[58] Field of Search ............... 371/15.1, 16.1; 364/274.5, 274.6, 274.7, 276.3; 395/53, 61, 77, 916, 917, 575

[56] References Cited
U.S. PATENT DOCUMENTS

| | | | |
|---|---|---|---|
| 4,964,125 | 10/1990 | Kim | 371/15.1 |
| 5,067,129 | 11/1991 | Evans et al. | 371/16.1 |
| 5,107,497 | 4/1992 | Lirov et al. | 371/15.1 |
| 5,107,500 | 4/1992 | Wakamoto et al. | 371/15.1 |
| 5,109,380 | 4/1992 | Ogino | 371/15.1 |

*Primary Examiner*—Charles E. Atkinson
*Attorney, Agent, or Firm*—Evenson, Wands, Edwards, Lenahan & McKeown

[57] ABSTRACT

A device for finding faults in a target system that has a plurality of "LRUs", which are the lowest replaceable units in the target system. The fault finding device receives input data relating to a state of the target system, stores a probability of failure of individual LRUs of the target system, and stores rules, these rules relating conclusions and premises, with at least some of the conclusions identifying a faulty LRU. The device determines a certainty of a conclusion of a stored rule in response to a comparison of the premises of the rule and the input data, and orders the conclusions of the stored rules as a function of both the probability of failure of individual LRUs and the certainties of conclusions of the stored rules.

33 Claims, 6 Drawing Sheets

|   | 1 | 2 | 3 | → N |
|---|---|---|---|---|
| 1 | 0 | 0 | 1 | 0 |
| 2 | 0 | 0 | 0 | 1 |
| 3 | 0 | 1 | 0 | 0 |
|   | 0 | 0 | 0 | 0 |
|   | 0 | 0 | 1 | 0 |
| ↓ N | 0 | 0 | 0 | 1 |

FAULT FINDER EXPERT SYSTEM

FIELD OF THE INVENTION

The present invention relates to the field of artificial intelligence and expert systems, and more specifically, to the finding of faults in a target system.

BACKGROUND OF THE INVENTION

One of the problems in complex systems, such as computer systems and other systems using computers, is their increasing complexity. As a result, ever more complex knowledge, experience and training are needed to operate, maintain and service these systems. Many of these complex systems have fault isolation software and sensor hardware that find faults in the system in a fixed, non-adaptable way. The failure modes of these systems are only partially known by the design engineers at the time the system is first built. This fixed logic is built into the system before field experience is gained. Each new system that is designed, therefore, needs custom logic that will fault isolate its components and topology, requiring re-writing of software as engineers "re-invent" each new system's logic for fault isolation.

To solve this problem, artificial intelligence techniques have been applied to isolate faults in a "target system", (the system being fault isolated). This allows for a more flexible approach to fault isolation, as the fault isolator can be generalized so as not to be restricted to finding faults in only one specific type of target system. For example, target systems can be a computer system, a communications system, or even the human body.

One of the artificial intelligence techniques that has been used is a rule-based approach, in which there are a number of stored rules in an "IF premise, THEN conclusion" format. These rules are created by a human who is expert in the target system fault diagnosis (based on past experience). The rules attempt to relate possible states of the target system with fault diagnoses. In a fault isolation episode, the states of the target system are compared with the premise of each of the rules, while the conclusions of the rules provide the fault diagnoses.

Known rule-based fault isolation devices use either forward or backward chaining in what is known as the "inference process". This is the process of inferring conclusions from given
a knowledge base and from data. The process of inferencing involves matching the knowledge base with the data an producing conclusions.

One of the problems in using either forward or backward chaining is that only single conclusion is presented to the user of the fault isolation device, since the goal of forward and backward chaining is to reach a single conclusion. This presents obvious difficulties if the conclusion that is presented turns out not to isolate the fault in the target system.

Another problem in rule-based systems is in the matching of the rules in the knowledge base with the data. Rule-based systems typically require an exact match of the rules in the knowledge base with the data. Unfortunately, many target systems being fault isolated do not provide data that exactly matches the premises created by the expert and stored in the knowledge base. This prevents the fault isolation device from solving situations that are very close to situations accommodated by the rules, but are not exactly the same.

A further deficiency of known rule-based systems is that they typically do not learn from their own fault isolation experiences in order to provide a more accurate current fault isolation. In other words, the information in the knowledge base is not updated to reflect the success or failure of a conclusion in isolating the fault of a target system, to thereby provide an accurate indication of how much confidence should be placed in the rule that was tried in isolating the fault.

One of the features of rule-based systems is that they contain rules in which a certain degree of confidence in their correctness can be placed. In other words, for a given state of the target system, there is a certain possibility for each rule that this particular rule will provide a correct conclusion. This is known as a rule possibility. What such rule-based systems do not take into account, however, is the prior history of the target system. For example, two rules may present conclusions that point to two different components of the target system as the fault, and prior history with the target system shows that one of these components has failed fifty times, while the other component has only failed once. A human expert would certainly consider this "probability of failure" information to be relevant, but typical rule-based systems do not take probability into account. Instead, they rely on rule possibility alone in presenting conclusions.

There is a need for a method and a device that will isolate faults in a target system and overcome the deficiencies in prior fault isolation devices, and thereby provide more accurate diagnoses of faults in a target system.

SUMMARY OF THE INVENTION

This and other needs are met by the present invention which provides a device for finding faults in a target system that has a plurality of "LRUs", which are the lowest replaceable units in the target system. The fault finding device has means for receiving input data relating to a state of the target system, means for storing a probability of failure of individual LRUs of the target system, and means for storing rules, these rules relating conclusions and premises, with at least some of the conclusions identifying a faulty LRU. The device has means for determining a certainty of a conclusion of a stored rule in response to a comparison of the premises of the rule and the input data, and means for ordering the conclusions of the stored rules as a function of both the probability of failure of individual LRUs and the certainties of conclusions of the stored rules.

By providing for ordering of multiple conclusions as a function of both probability and possibility, the present invention presents a device for fault finding that relies both on expert knowledge, as represented by the rule possibilities, and on past experience, as represented by the probability of failure of the individual LRUs. This approach has the advantage of allowing more accurate fault finding in target systems.

In certain embodiments of the present invention, the device includes means for updating a current certainty value of a rule in the knowledge base when the correctness of the conclusion of that rule has been verified by a user. This allows the device to learn from its experience in fault finding to provide more accurate diagnoses in future fault finding episodes.

The present invention also provides a method of finding faults in a target system that has a plurality of LRUs. This method includes the steps of receiving input data relating to a state of the target system, storing a probability of failure of individual LRUs of the target system, and maintaining a set of stored rules, these rules relating conclusions and premises, with at least some of the conclusions identifying a faulty LRU. The premises of the stored rules are compared with the input data. A certainty of a conclusion of a stored rule is determined in response to the comparison of the premises of the rule and the input data. The conclusions of the stored rules are ordered as a function of both the probability of failure of individual LRUs and the certainties of conclusions of the stored rules.

Other objects, advantages and novel features of the present invention will become apparent from the following detailed description of the invention when considered in conjunction with the accompanying drawings.

BRIEF DESCRIPTION OF THE DRAWINGS

Figure 6:
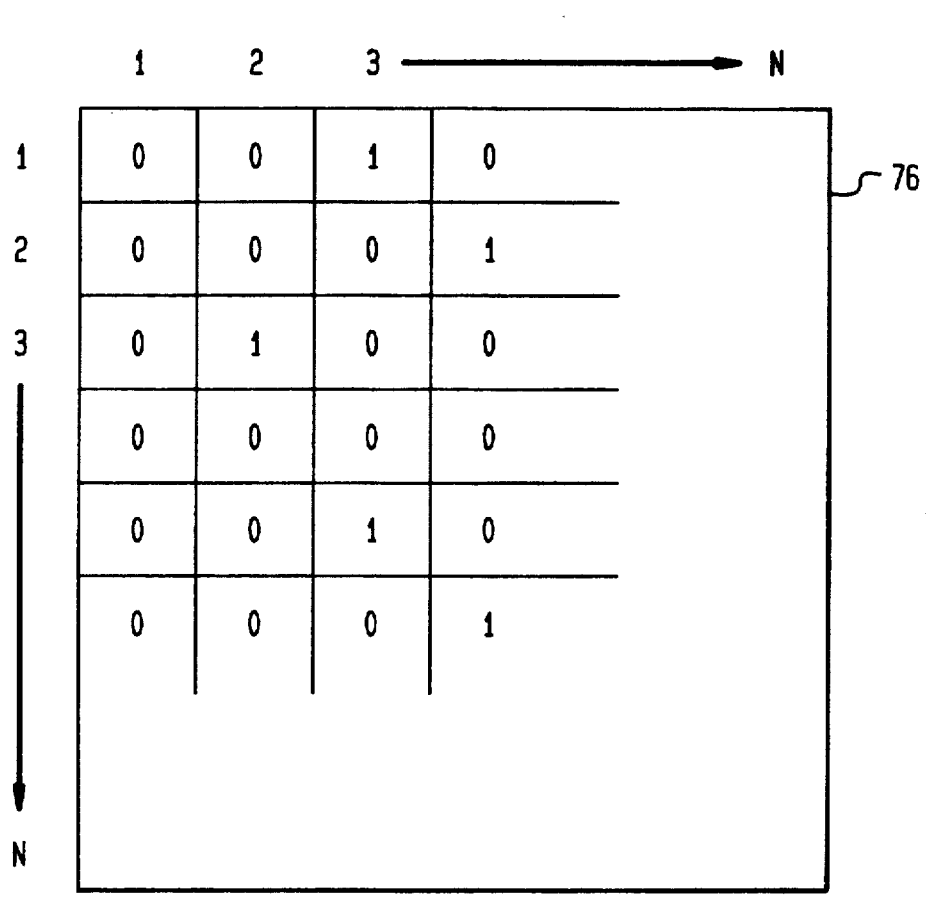

FIG. 6 is a block diagram illustrating a bit matrix used in the inference process of FIG. 2.

DETAILED DESCRIPTION OF THE DRAWINGS

Figure 1:
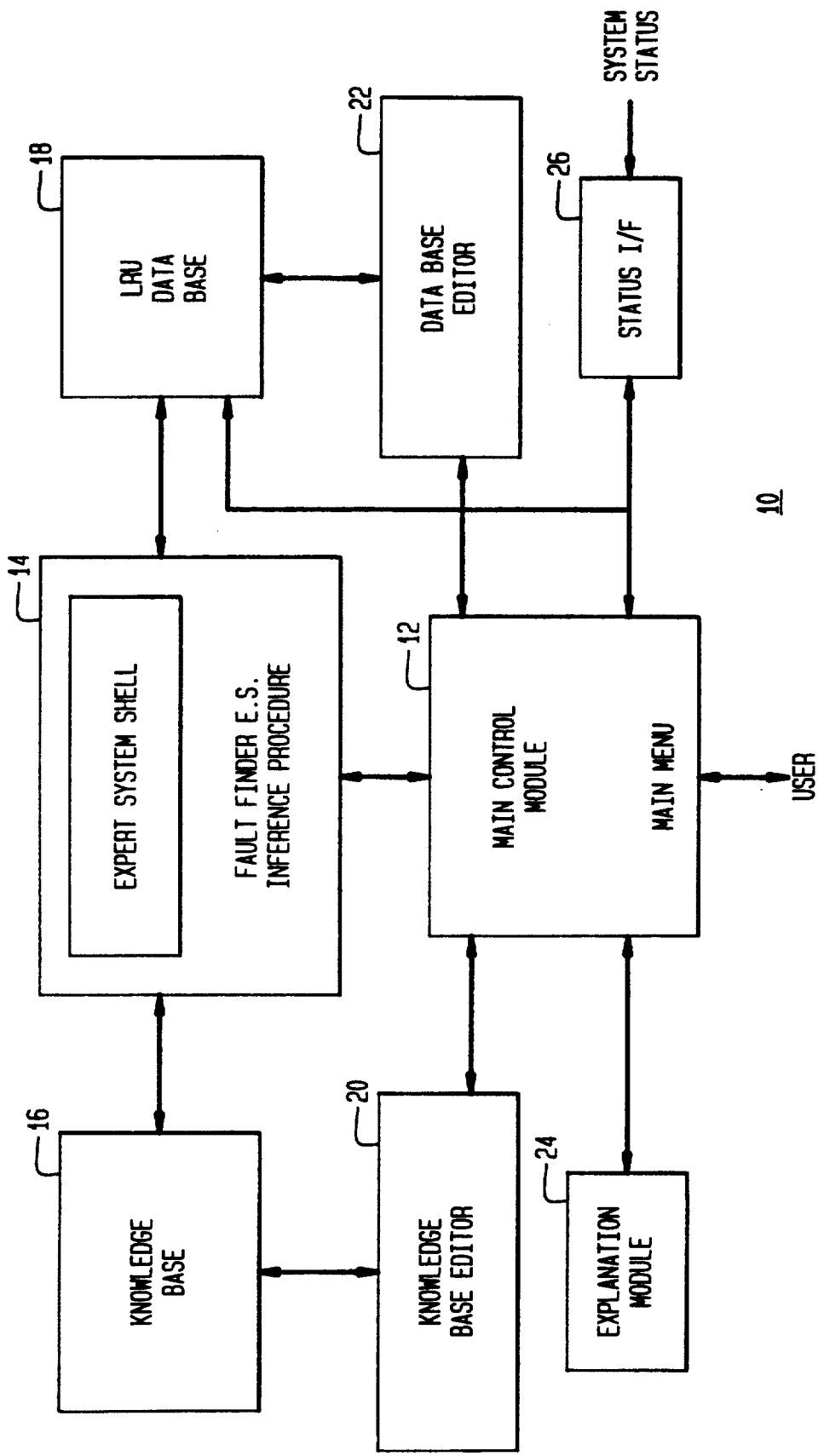
FIG. 1 is a block diagram of a fault finding device constructed in accordance with an embodiment of the present invention.

A block diagram of a fault finder 10 constructed in accordance with an embodiment of the present invention is illustrated in FIG. 1. The fault finder 10 has a main control module 12 that provides an interface between a human user and the remaining components of the fault finder 10. The entire fault finder 10 can be implemented with a personal computer (PC/AT), and the software for the fault finder 10 can be written, for example, in TURBO PASCAL.

The main control module 12 is coupled to an expert system shell 14 which performs inference processing to produce a conclusion(s). The expert system shell 14 provides its conclusions to the user through the main control module 12.

The expert system shell 14 receives information from a number of sources. The first of these sources is a knowledge base 16 which, as described in more detail later, contains a number of rules that have been provided by an expert troubleshooter of the "target system". A target system is defined as the particular system having a fault whose cause is to be identified. Examples of target systems include computer systems, communication systems, automobiles and even the human body.

The expert system shell 14 also receives user input data from the main control module 12. Finally, the expert system shell 14 receives data from an LRU database 18. An "LRU" is a lowest replaceable unit of the target system and is a common term in the art of fault diagnosis. The LRUs are defined in the LRU database 18. Any level of component in a target system may be designated an LRU. Certain LRUs may contain other LRUs. For example, three different LRUs may make up a larger LRU. The information in the LRU data base 18 contains, for example, the number of times each of the LRUs have failed in a target system. The knowledge base 16 will contain the rules for the interrelationships of the LRUs.

The knowledge base 16 is edited by a knowledge base editor 20, and the LRU data base 18 is edited by a data base editor 22.

An explanation module 24 is coupled to the main control module 12 and provides an explanation to the user as to how a conclusion was reached.

A status interface 26 is coupled to the main control module 12 and to the LRU data base 18, as well as to the target system. The status interface 26 allows direct input of status or data from the target system to the fault finder 10, instead of being input by the user.

Figure 2:
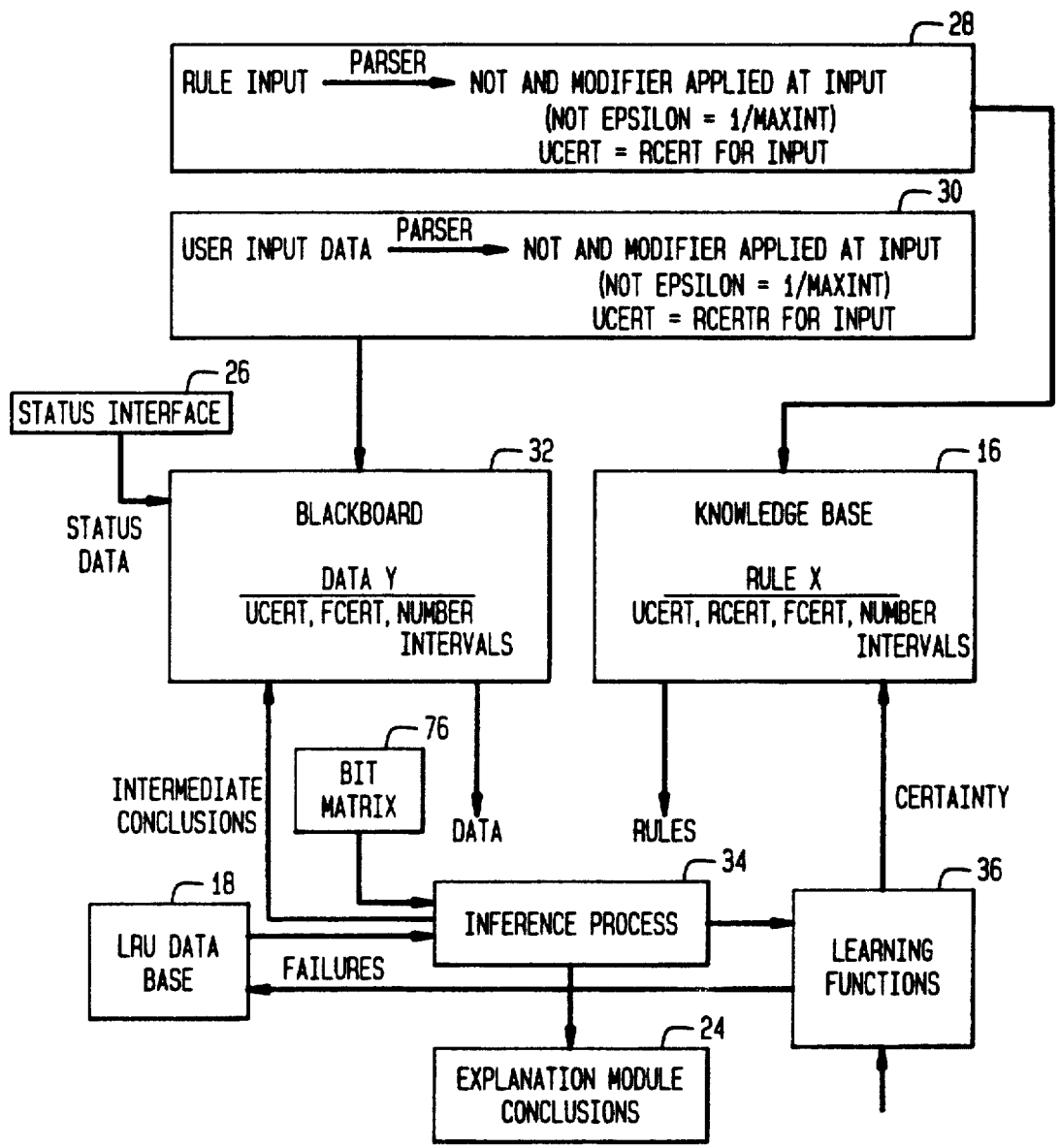
FIG. 2 is a block diagram illustrating an inference process flow according to an embodiment of the present invention.

An embodiment of the inference procedure flow is illustrated in FIG. 2. In step 28, rules are input to the knowledge base 16. These rules are parsed in step 28 so that the knowledge base 16 will contain rules that are already parsed. Similarly, the user input data is parsed in box 30 and provided to a blackboard 32. This data is entered in the same basic format as the rules contained in the knowledge base 16. The parsing of the data and the rules and the storage of these pars ®d data and rules in the blackboard 30 and the knowledge base 16 speeds up the inference process, since the inference process is working on pre-parsed information and does not have to spend time in parsing.

The blackboard 32, as its name implies, basically acts as a scratch pad. The user input data from block 30 includes statements as to the state of the target system, the interfaces, or other data that is target system dependent. Since the structure of the blackboard 32 is very similar to the structure of the knowledge base 16, the inference process is more efficient in matching input data, premises, and conclusions. The blackboard 32 also receives status data from the status interface 26.

The data from the blackboard 32 and the rules from the knowledge base 16 are matched in an inference process 34. Before a final conclusion is reached, a number of intermediate conclusions may be reached by the inference process 34. These intermediate conclusions are fed back to the blackboard 32. When a final conclusion is reached by the inference process, it is provided to the explanation module 24, as well as to the main control module 12. The inference process 34 also receives data from the LRU data base 18 as to the fail rate of the LRUs.

The fault finder 10 relies upon feedback from the user in order to learn. After trying a conclusion suggested by the inference process of FIG. 2, the user will provide an indication as to success or failure of that conclusion to a learning function 36. If the LRU that has failed has been identified, the LRU database is is updated through the learning function 36 to reflect this failure for that particular LRU. The learning function 36 also provides a revision or updating of the certainty of a rule based upon the experience gained in the particular fault finding episode. The learning functions are applied to the knowledge base 16 and to the LRU data base 18 only after the user enters a yes or no answer as to the verified correctness of the conclusion.

The inferencing process 34 involves matching the premises of the rules in the knowledge base 16 with the data from the blackboard 32 to produce conclusions. The inference process, in the illustrated embodiment, uses "fuzzy matching", a well-known technique of matching, for comparing the input data, the premises and the conclusions.

In the inference process 34, the conclusion of a rule becomes true if and only if the fuzzy matching process generates results which are above or equal to a threshold of 0.6. If the conclusion becomes true, then that rule is "fired" and its conclusion is placed on the blackboard 32, along with its firing certainty. (The term "fired" is a well-known term in expert systems for a rule being activated). The process is repeated until no more rules can be fired.

There are two steps in finding the degree to which two ranges are matched. First, it is necessary to find out the possible range of the variable in question and then utilize the matching procedure. When matching clauses of a premise, two cases must be considered: a clause contains the keyword "NOT"; and a clause does not contain the keyword "NOT". In the first case, the word "NOT" forces two intervals to be created. In the case where the clause does not contain the keyword "NOT", there is one continuous interval. Therefore, when two clauses are compared, it must be assumed that there may be four intervals to be considered.

The inference procedure, instead of presenting only a single conclusion to the user, uses direct chaining to provide the user with one or more conclusions that are ordered according to decreasing certainty. The conclusion with the highest certainty is provided as "the conclusion", but the user, through the use of the explanation module 24, may review all of the conclusions produced. The user will then try the suggested conclusion and provide feedback to the fault finder 10 through the learning function 36.

The knowledge base 16 is constructed of production rules of the form IF <premise> THEN <conclusion>. The premise and conclusion use the following grammar:

[the]KW1[of[the]KW2]is[not][modifiers{[KW3]-
[number][number to number]} where KW1,KW2 and KW3 are keywords, means optional and { } means one choice is required, number may be a real.

Letting p be the premise of a rule and c be the conclusion, then using the well-known BNF notation:

<p> = p/p or p/p and p/not p/(p)

<c> = c/c and c/not c/(c)

Each rule has an expert user assigned certainty value (Ucert), with a range from 0 to 1, that describes the belief of the expert user in the truthfulness of the conclusion at the time that the rule was initially entered into the knowledge base 16. This expert user assigned number is not changed by the system, but is used in the learning function 36 with other parameters to produce the final certainty and conclusion.

The knowledge base 16 is composed of rules of "system knowledge" or "shallow knowledge". An example of system knowledge is, "if two inputs are present and no output is present, then the LRU is faulted". Most technicians or support engineers that service target systems do not have the deep knowledge of how each LRU works or fails. However, this deep knowledge is not needed to fault isolate and replace the failed LRU. The system or shallow knowledge is not completely accurate in all cases, but a substantial amount of system maintenance can be done with the shallow knowledge represented in the knowledge base 16.

Figure 5:
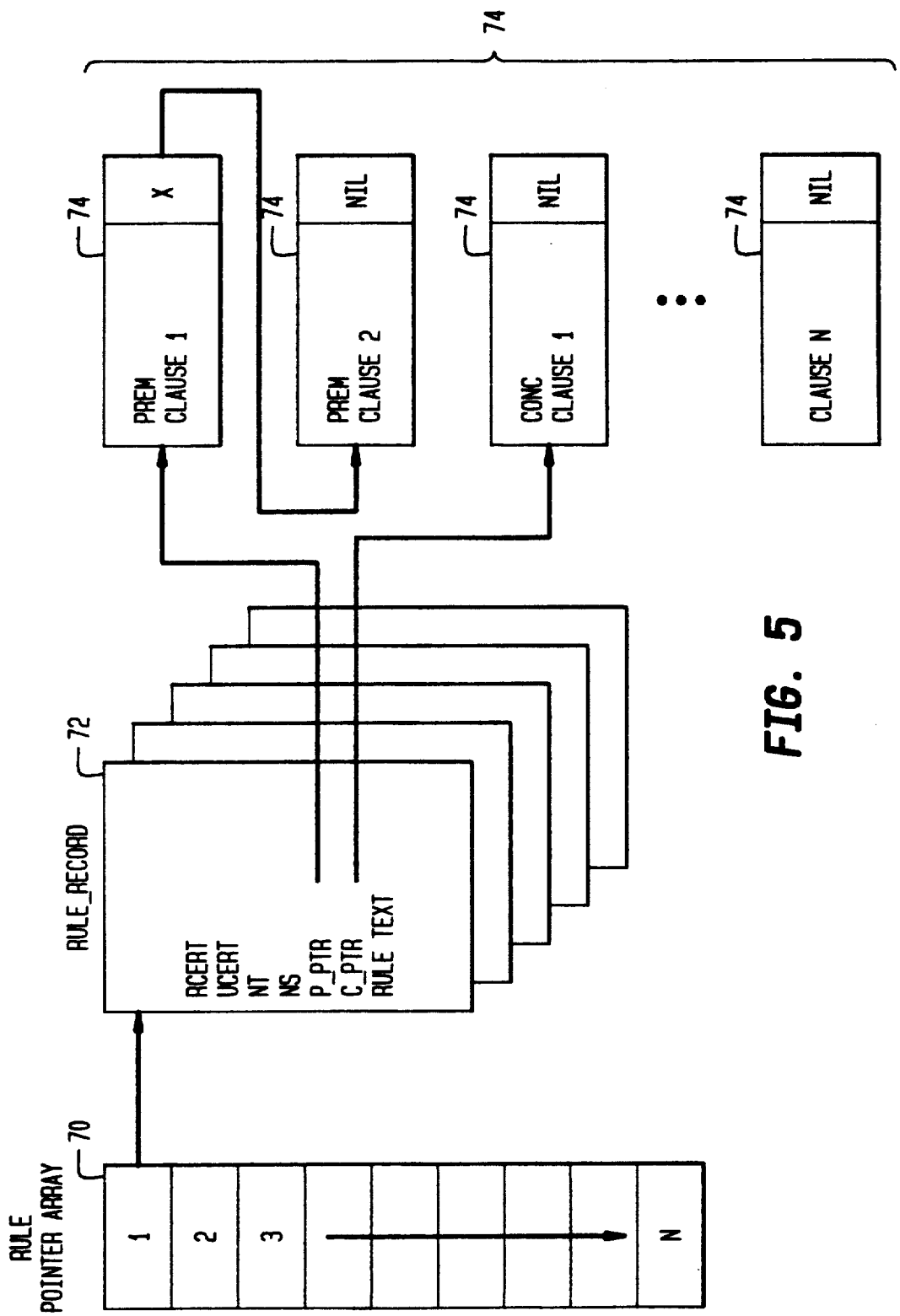
FIG. 5 is a block diagram of a knowledge base used in the fault finding device of FIG. 1.

Each conclusion contained in the knowledge base 16 is assigned a real number (Rcert), with a range from 0 to 1, that is derived in the inference process which represents that the possibility that this conclusion is correct. An embodiment of the knowledge base is illustrated in FIG. 5. Knowledge base has three major data structure types. First is the rule pointer array 70 which points to rule records that are dynamically allocated as needed. The array pointers in the rule pointer array 70 are set to nil unless a valid rule is pointed to. The rule records 72 are individual records of rules that contain certain information. This information includes Rcert which represents the certainty of a rule which the knowledge base 16 will derive itself; Ucert, which is the certainty of a rule that the user enters at the time the rule is entered and which never changes; NT, which represents the number of times the rule has been tried; NS, which is the number of times the rule has been successfully tried, P_PTR which points to a premise; C_PTR which is the conclusion pointer and points to a conclusion; and RULE TEXT which is the english text of the rule for reference purposes.

The blackboard structure is similar to the knowledge base structure (which allows for a faster matching process), and includes a blackboard pointer array 60, which points to blackboard records 62. Each blackboard record contains Ucert, which represents the user certainty of the rule; a premise pointer P_PTR; and PREM TEXT, which is the english text of the premise. The premise clauses 64 may be linked in a chain and have indexes that point to the next clause in the chain. The last clause in the chain will have a zero for an index.

A bit matrix 76 is also coupled to the inference process 34 and is a data structure used by the inference process 34 in the direct chaining of rules. The bit matrix 76 stores information concerning the interrelationships of rules. The bit matrix 76 is an N by N matrix where N equals the number of rules, and is defined as follows. Bit matrix [i, j]—1 if rule i may participate in the firing of rule j, and is 0 otherwise.

The bit matrix 76 is initialized to all zeros. Each rule is compared to all the other rules in the knowledge base 16 and the matrix 76 is updated with the results of the comparison. If a rule has all zeros in its row in the bit matrix, then the rule is a concluding rule (i.e., a rule that follows no other rules). If a rule has all zeros, then the rule is fired by no other rule and requires user entered data in order to be fired.

Clauses of premises often contain what are known as "modifiers". Each modifier has a lower and an upper fuzzy value. In the grammar defined previously, the modifier may be a single number, or a range "number to number". The following table provides an example of modifiers and the ranges for the modifiers:

| Exactly | 1.00 | 1.00 |
|---|---|---|
| Almost | 0.97 | 0.99 |
| More_or_less | 0.90 | 1.10 |
| Nearly | 0.95 | 0.99 |
| Approximately | 0.85 | 1.15 |
| Around | 0.85 | 1.15 |
| About | 0.85 | 1.15 |
| Somewhat | 0.80 | 1.20 |
| Slightly | 0.75 | 1.25 |
| Barely | 0.65 | 0.95 |

The learning function for the knowledge base 16 uses four parameters associated with each rule. These parameters are the expert's confidence in the conclusion (Ucert), the number of times a rule was tried (NT), the number of times the rule was successful (NS) and the output of a "fuzzy" function (Rcert). The fuzzy function (Rcert) uses the above parameters to calculate the possibility that the conclusion is correct according to the following equation: Rcert:=Rcert−0.5 * (Rcert - NS/NT).

When the rule is first entered into the knowledge base 16, the output of the fuzzy function (Rcert) is initialized to the user certainty (Ucert). The factor 0.5 is applied to cut the rate of change in the learning process. This factor helps stop large oscillations but allows multiple changes, through experience, to accumulate in a direction. For example, if Rcert =Ucert=0.9 for a first run with a success, then NS=1, and NT=1 then, according to the formula Rcert=0.95. If the next run is a failure, then NS=1, and NT=2, leading to Rcert=0.725. A third run with a failure provides NS=1, NT=3 and Rcert will then drop to 0.529. Thus, the more times a run for a rule is made resulting in a failure of that rule, then the less certain is that rule.

As stated before, the learning functions are applied to the knowledge data base 16 and the LRU data base 18 only after the user enters a yes or no response as to the verified correctness of the conclusion.

Figure 3:
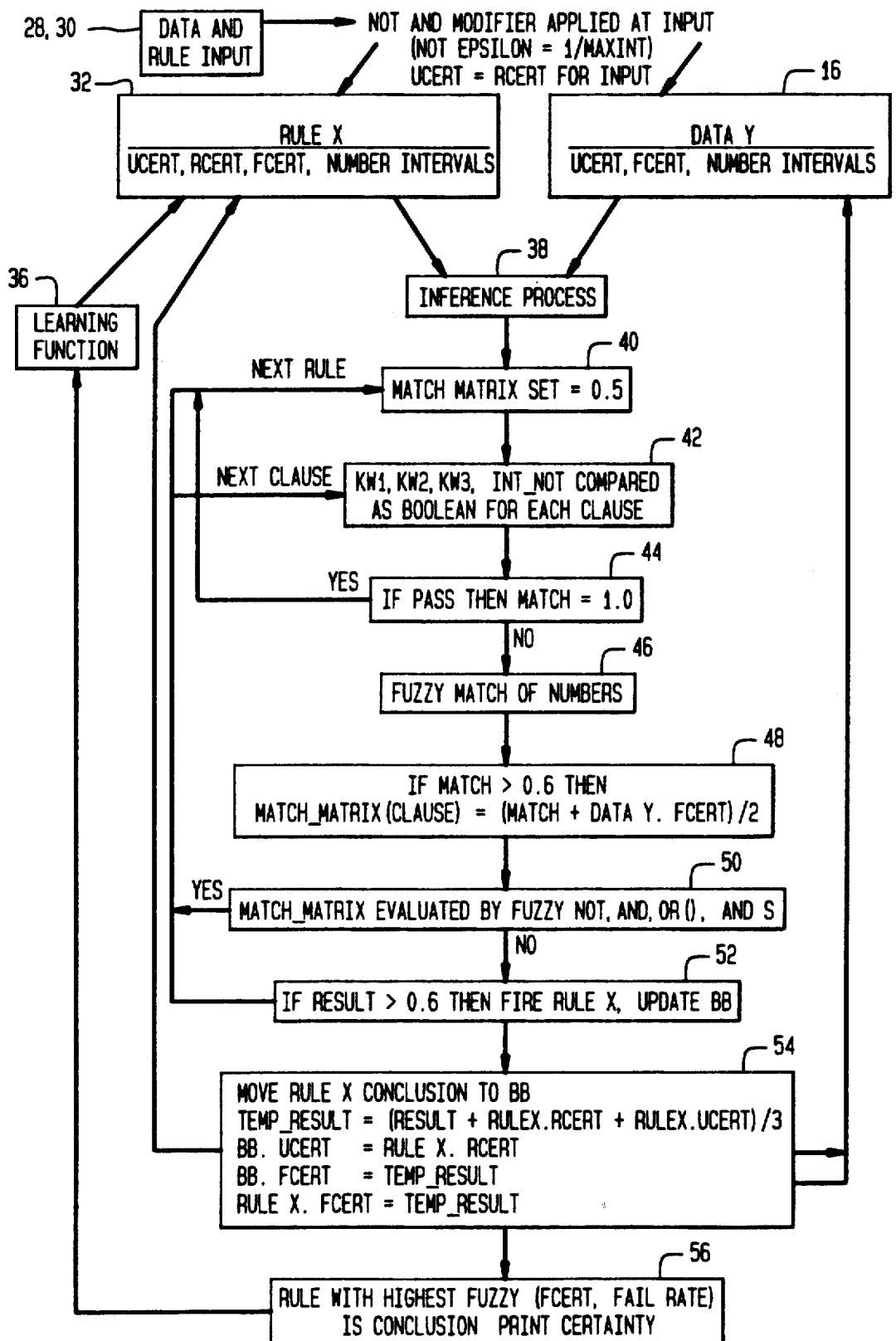
FIG. 3 is a flow diagram of certainty handling in the inference process of FIG. 2.
Figure 4:
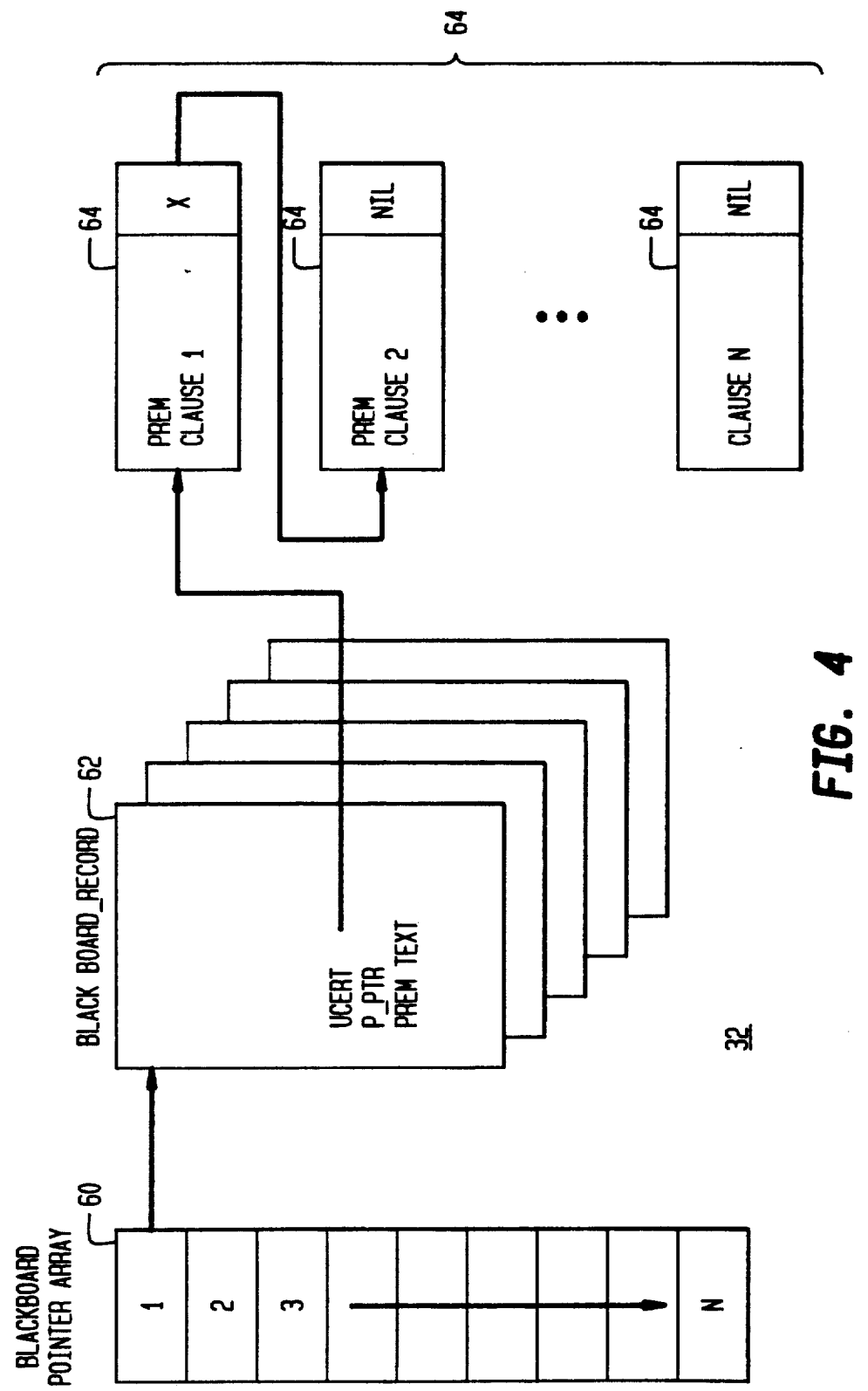
FIG. 4 is a block diagram of a blackboard structure used in the fault finding device of FIG. 1.

The inference process is illustrated as a flow diagram in FIG. 3. The inference process start block 38 receives and compares the premises of each rule against the blackboard data in the blackboard 32. At the start of each rule matching process, a match matrix (not illustrated) of fuzzy values for each clause in the premise is initialized to 0.5. This is because if a clause is not on the blackboard 32, there is a 0.5 certainty that the clause was a correct assumption. This is performed in step 40. In step 42, key words KW1, KW2, KW3, and the internal NOT are compared with boolean matching if the third key word KW3 is a word. This is done for each of the clauses in step 42. If pass, then match equal 1.0 in step 44. Fuzzy matching of numbers and intervals is performed in step 46.

If the fuzzy match of numbers is greater than 0.6, then the following function is used to update the match matrix: match_matrix (clause)=(match+data y. Fcert)/2. This is performed in step 48. If the match is greater than 0.6, the match matrix is updated and the next rule is tried back in step 40.

Once the match matrix has been updated for each of the clauses of a premise, the final matching value for a premise is achieved by combining the individual clauses of the premise by using fuzzy ANDS, ORS, and NOTS. This is performed in step 50. As shown in step 52, if the result is greater than 0.6, then the rule x is fired, and the blackboard 32 is updated. The next rule is retrieved and the process steps 40-52 are repeated.

Whenever a rule is fired, the blackboard 32 must be updated. The inference procedure blackboard updating process uses the Ucert and Rcert values for each rule and a premise matching certainty as it fires a rule to accumulate a final firing certainty (Fcert) for that rule.

The fuzzy function for handling the firing certainty Fcert for purposes of updating the blackboard 32 is as follows: temp—result =(result+rule(x).Ucert-+rule(x).Rcert)/3; and Rule(x).Fcert=temp—result. This value of the firing certainty Fcert is stored in the knowledge base with the rule for later reference. If the rule ends up being the best (i.e. most certain) concluding rule, this composite conclusion certainty (Fcert) is the final conclusion certainty.

The blackboard 32 is updated by copying the conclusion of the fired rules to the blackboard 32 along with the following values: BB.Ucert=rule(x).Rcert; BB.Fcert=temp—result. This is performed in step 54.

As stated before, rules can fire other rules. This occurs when the conclusion of a rule is an intermediate conclusion as opposed to a final conclusion. The inference process is terminated when no more rules can be fired. This occurs when only rules with final conclusions have been fired, or if no rules with final conclusions have been fired s that only rules with intermediate conclusions that require more user input data are remaining.

In step 56, the final conclusion certainty (FFcert) is determined. After the inference process is terminated, one or a plurality of concluding rules ma have been fired. Certainty (i.e. possibility) is used in conjunction with probability to reach the most likely correct final conclusion from the plurality of concluding rules. The advantage of this approach is made apparent when considering the example of an analysis which leads to two conclusions that point to different LRUs as a cause of a fault. If the certainty of both of these conclusions are approximately equal, the fact that in the past one of the LRUs has failed a hundred times and the other LRU has failed only one time (i.e. the probability of failure) would influence the user to place more faith in the conclusion in which the LRU has failed many times.

In the embodiment of the present invention illustrated in FIG. 3, classes of conclusion certainty using the Fcert and the fail_rate values are defined and are used to determine the rule with the highest fuzzy certainty. In this method, points are assigned to ranges in the following manner:

The following probability ranges are defined for fail_rate values: High, Med., Low where 0.7<=High<=1.0, and High Probability=3 points 0.3<=Med.<0.7, and Med. Probability=2 points 0.0<=Low<0.3, and Low Probability=1 point and the following ranges for rule firing certainty are defined: High, Med., Low where 0.9<=High<=1.0, and High Certainty=3 points 0.7<=Med.<0.9, and Med Certainty=2 points 0.6<=Low 0.7, and Low Certainty=1 point an example of a table of combinations is provided below:

| Fcert | Fail Rate | Points | Class |
|-------|-----------|--------|-------|
| High  | High      | 6      | 1     |
| High  | Med.      | 5      | 2     |
| High  | Low       | 4      | 5     |
| Med.  | High      | 5      | 3     |
| Med.  | Med.      | 4      | 4     |
| Med.  | Low       | 3      | 7     |
| Low   | High      | 4      | 6     |
| Low   | Med.      | 3      | 8     |
| Low   | Low       | 2      | 9     |

If two or more conclusions are in different classes, then the conclusion with the lowest number class (i.e. 1) is presented as the most likely correct conclusion. The remaining possible conclusions are ordered according to these classes. If two or more conclusions fall in the same class, a final conclusion certainty (FFcert) is calculated from the final composite conclusion certainty (Fcert) and the LRU fail_rate values from the LRU database 18. The final conclusion certainties (FFcert) can be calculated by simply averaging the final composite conclusion certainty (Fcert) and the fail_rate values. However, another embodiment provides for a weighted average of the final composite conclusion certainty (Fcert) and the LRU fail_rate value (Fail_Rate) to form the final conclusion certainty (FFcert). The two final conclusion certainties (FFcert) can then be compared, and the conclusion with the higher final conclusion certainty (FFcert) will be tried first. In forming the weighted average, an embodiment of the invention weights the Fcert for a rule at 110% and the Fail_Rate for that rule at 90%. Other weighting values can be chosen.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. A device for finding faults in a target system that has a plurality of LRUs, comprising:
   means for receiving input data relating to a state of the target system;
   means for storing a probability of failure of individual LRUs of the target system;
   means for storing rules, said rules relating conclusions and premises, at least some of said conclusions identifying a faulty LRU;
   means for determining a certainty of a conclusion of a stored rule in response to the comparison of the premises of the rule and the input data;
   means for ordering the conclusions of the stored rules as a function of both the probability of failure of individual LRUs and the certainties of conclusions of the stored rules; and
   means for providing said ordered conclusions to a user via a computer-user interface to thereby indicate a most likely LRU to be a cause of the fault in the target system.

2. The device of claim 1, wherein the means for storing rules is a knowledge base coupled to the means for determining certainties, said knowledge base containing stored rules having premises and conclusions, each rule having associated: a value representing a number of times the rule was tried; a value representing a number of times the rule was successful; an expert certainty value representing a human expert's certainty in correctness of the rule; a current certainty value representing a current certainty in correctness of the rule as a function of the number of times the rule was tried and the number of times the rule was successful.

3. The device of claim 2, wherein the means for storing a probability of failure is an updatable LRU data base in which a probability of failure for each of the LRUs in the target system is provided.

4. The device of claim 3, wherein said means for receiving input data includes a blackboard having an output coupled to the means for determining a certainty of a conclusion, said blackboard providing said input data to said means for determining a certainty of a conclusion.

5. The device of claim 4, wherein the input data contained in the blackboard and the rules stored in the knowledge base are parsed.

6. The device of claim 5, further comprising means for updating the current certainty value of a rule in the knowledge base when the correctness of the conclusion of that rule has been verified by a user.

7. The device of claim 6, wherein the means for updating the current certainty value updates the current certainty value according to the equation: $Rcert := Rcert - 0.5 * (Rcert - NS/NT)$, where Rcert is the current certainty value, NS is the value representing the number of times the rule was successful, and NT is the value representing the number of times the rule was tried.

8. The device of claim 7, further comprising a status interface coupled to the blackboard, said status interface providing input data from the target system directly to the blackboard.

9. The device of claim 8, wherein the means for matching input data to the stored rules includes means for performing fuzzy matching of the input data to the stored rules to produce a match value of the match of input data to a rule.

10. The device of claim 9, wherein the means for matching input data to the stored rules further includes means for firing a particular rule if and only if the means for performing fuzzy matching produces a match value above a threshold value.

11. The device of claim 10, wherein the threshold value is 0.6.

12. The device of claim 10, further comprising means for updating the blackboard to contain a firing certainty for a particular rule as a function of the match value, the expert certainty value and the current certainty value for that particular rule.

13. The device of claim 12, wherein the means for ordering orders the conclusions according to a predefined classing of combinations of probabilities of failure and certainties of conclusion.

14. The device of claim 13, further comprising means for combining the probabilities of failure of LRUs with the certainties of conclusion of rules to provide final firing certainties for two or more rules when two or more conclusions are placed into the same class by the means for ordering.

15. The device of claim 14, wherein the means for combining includes means for weighting the probability of failure and the certainty of conclusion of a rule and summing the weighted probability of failure and the weighted certainty of conclusion of a rule to produce a final firing certainty of a rule.

16. The device of claim 15, further comprising an explanation module coupled to the means for ordering, the explanation module providing a user with rules that are not concluding rules and which need more input data in order to reach a conclusion.

17. The device of claim 16, wherein the means for determining certainties and the means for ordering include means for performing direct chaining of the stored rules.

18. A method of using a computer for finding faults in a target system that has a plurality of LRUs, comprising:

the computer receiving input data relating to a state of the target system;

storing in a memory of the computer a probability of failure of individual LRUs of the target system;

maintaining in the memory of the computer a set of stored rules, said rules relating conclusions and premises, at least some of said conclusions identifying a faulty LRU;

the computer comparing the premises of the stored rules and the input data;

the computer determining a certainty of a conclusion of the stored rule in response to the comparison of the premises of the rule and the input data;

the computer ordering the conclusions of the stored rules as a function of both the probability of failure of individual LRUs and the certainties of conclusions of the stored rules; and the computer providing said ordered conclusions to a user via a computer-user interface to thereby indicate a most likely LRU to be a cause of the fault in the target system.

19. The method of claim 18, wherein the stored rules are maintained in a knowledge base said knowledge base containing stored rules having premises and conclusions, each rule having associated: a value representing a number of times the rule was tried; a value representing a number of times the rule was successful; an expert certainty value representing a human expert's certainty in correctness of the rule; a current certainty value representing a current certainty in correctness of the rule as a function of the number of times the rule was tried and the number of times the rule was successful.

20. The method of claim 19, wherein the probability of failure for each of the LRUs in the target system is stored in an updatable LRU data base.

21. The method of claim 20, wherein the input data is received in a blackboard, said blackboard providing said input data for the determining of a certainty of a conclusion.

22. The method of claim 21, wherein the input data contained in the blackboard and the rules stored in the knowledge base are parsed.

23. The method of claim 22, further comprising the step of updating the current certainty value of a rule in the knowledge base when the correctness of the conclusion of that rule has been verified by a user.

24. The method of claim 23, wherein the current certainty value is updated according to the equation: $Rcert := Rcert - 0.5 * (Rcert - NS/NT)$, where Rcert is the current certainty value, NS is the value representing the number of times the rule was successful, and NT is the value representing the number of times the rule was tried.

25. The method of claim 24, further comprising the step of providing input data from the target system directly to the blackboard via a status interface.

26. The method of claim 25, wherein the step of comparing includes input data to the premises of the stored rules includes the step of performing fuzzy matching of the input data to the premise of the stored rules to produce a match value.

27. The method of claim 26, further comprising the step of firing a particular rule if and only if the step of performing fuzzy matching produces a match value above a threshold value.

28. The method of claim 27, wherein the threshold value is 0.6.

29. The method of claim 27, further comprising the step of updating the blackboard to contain a firing certainty for a particular rule as a function of the match value, the expert certainty value and the current certainty value for that particular rule.

30. The method of claim 29, wherein the conclusions are ordered according to a predefined classing of combinations of probabilities of failure and certainties of conclusion.

31. The method of claim 30, further comprising the step of combining the probabilities of failure of LRUs with the certainties of conclusion of rules to provide final firing certainties for two or more rules when two or more conclusions are placed into the same class by the step of ordering the conclusions.

32. The method of claim 31, wherein the step of combining includes the step of weighting the probability of failure and the certainty of conclusion of a rule and summing the weighted probability of failure and the weighted certainty of conclusion of a rule to produce a final firing certainty of a rule.

33. The method of claim 32, further comprising the step of providing a user with rules that are not concluding rules and which need more input data in order to reach a conclusion.

* * * * *